(12) United States Patent
Zistl et al.

(10) Patent No.: US 6,313,538 B1
(45) Date of Patent: Nov. 6, 2001

(54) SEMICONDUCTOR DEVICE WITH PARTIAL PASSIVATION LAYER

(75) Inventors: Christian Zistl, Dresden (DE); Paul R. Besser; Eric M. Apelgren, both of Austin, TX (US); Nicholas J. Kepler, Saratoga, CA (US); Srikanteswara Dakshina-Murthy, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/489,479

(22) Filed: Jan. 21, 2000

(51) Int. Cl.[7] .................................................. H01L 23/48
(52) U.S. Cl. ......................................... 257/760; 257/762
(58) Field of Search ..................................... 257/760, 762

(56) References Cited

U.S. PATENT DOCUMENTS

| | | | |
|---|---|---|---|
| 5,751,066 | * 5/1998 | Havemann | 257/759 |
| 5,970,373 | * 10/1999 | Allen | 438/624 |
| 6,040,628 | * 3/2000 | Chiang et al. | 257/760 |
| 6,188,135 | * 2/2001 | Chan et al. | 257/751 |

* cited by examiner

Primary Examiner—T. N. Quach
(74) Attorney, Agent, or Firm—Williams, Morgan & Amerson, P.C.

(57) ABSTRACT

A semiconductor device includes a first dielectric layer, a plurality of conductive interconnections formed in the first dielectric layer, a patterned passivation layer formed above the conductive interconnections, and a second dielectric layer formed above and in contact with the passivation layer and the first dielectric layer. A method for forming a semiconductor device includes providing a base layer, forming a first dielectric layer over the base layer, forming a plurality of conductive interconnections in the first dielectric layer, forming a patterned passivation layer above the conductive interconnections, and forming a second dielectric layer above and in contact with the passivation layer and the first dielectric layer.

9 Claims, 2 Drawing Sheets

SEMICONDUCTOR DEVICE WITH PARTIAL PASSIVATION LAYER

BACKGROUND OF THE INVENTION

1. Field of the Invention

This invention relates generally to the field of semiconductor device manufacturing, and, more particularly, to a method for forming a semiconductor device with partial passivation layers.

2. Description of the Related Art

A conventional integrated circuit device, such as a microprocessor, is typically comprised of many thousands of semiconductor devices, e.g., transistors, formed above the surface of a semiconductive substrate. For the integrated circuit device to function, the transistors must be electrically connected to one another through conductive interconnect structures. Many modem integrated circuit devices are very densely packed, i.e., there is very little space between the transistors formed above the substrate. Thus, these conductive interconnect structures must be made in multiple layers to conserve plot space on the semiconductive substrate.

The conductive interconnect structures are typically accomplished through the formation of a plurality of conductive lines and conductive plugs, commonly referred to as contacts or vias, formed in alternative layers of dielectric materials formed on the device. As is readily apparent to those skilled in the art, the conductive plugs are means by which various layers of conductive lines, and/or semiconductor devices, may be electrically coupled to one another.

A contact is generally used to define an interconnect structure (e.g., using polysilicon or metal) to an underlying polysilicon layer (e.g., source/drain or gate region of a transistor), while a via denotes a metal to metal interconnect structure. In either case, a contact opening is formed in a dielectric layer overlaying the conductive member. A second conductive layer is then formed in the contact opening and electrical communication is established with the contact member.

Commonly, passivation layers, such as silicon nitride, are formed between device layers of the semiconductor device. In cases where copper is used to form the conductive lines and interconnects in the semiconductor device, the passivation layer acts as a barrier layer to prevent diffusion of the copper and as an antireflective coating for subsequent photolithography. After forming the passivation layer, an inter-level dielectric (ILD) layer is formed. The ILD layer isolates the overlaying layers and provides the dielectric base in which subsequent lines and interconnects of the next device layer are formed. Commonly used ILD materials are tetraethoxysilane (TEOS) and fluorine doped TEOS (F-TEOS). A new class of dielectric materials, commonly referred to as low-k dielectrics, have also been employed for ILD layers. Low k dielectrics typically have a dielectric constant less than 3.0 and thus provide enhanced isolation functions to allow reduced device sizes. A commonly available low k dielectric material is Black Diamond, sold by Applied Materials, Inc.

One disadvantage of passivation layers is that their dielectric constants are typically higher than those of the ILD layers. This increases the line-to-line capacitance of the particular layer being covered. Hence, the effective dielectric constant of the layer is increased, potentially reducing the performance of the device.

Another disadvantage of passivation layers is that they are optically more dense than the ILD layers. As subsequent layers are formed on the semiconductor device, they are aligned with the first metal layer or the substrate by evaluating the strength of an electrical signal imposed thereon. The increased density of the passivation layers reduces the accuracy of the alignment process, giving rise to a higher number of potential alignment errors as the number of layers increases.

The present invention is directed to overcoming, or at least reducing the effects of, one or more of the problems set forth above.

SUMMARY OF THE INVENTION

One aspect of the present invention is seen in a semiconductor device including a first dielectric layer, a plurality of conductive interconnections formed in the first dielectric layer, a patterned passivation layer formed above the conductive interconnections, and a second dielectric layer formed above and in contact with the passivation layer and the first dielectric layer.

Another aspect of the present invention is seen in a method for forming a semiconductor device. The method includes providing a base layer, forming a first dielectric layer over the base layer, forming a plurality of conductive interconnections in the first dielectric layer, forming a patterned passivation layer above the conductive interconnections, and forming a second dielectric layer above and in contact with the passivation layer and the first dielectric layer.

BRIEF DESCRIPTION OF THE DRAWINGS

The invention may be understood by reference to the following description taken in conjunction with the accompanying drawings, in which like reference numerals identify like elements, and in which.

Figure 1:
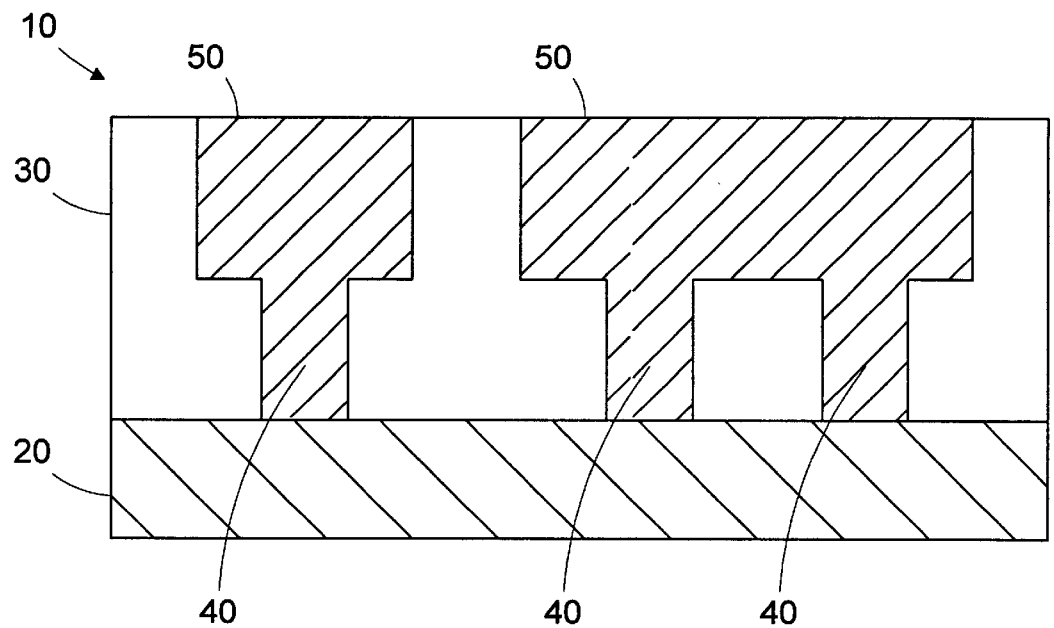
FIG. 1 is a cross section view of a semiconductor device in the process of being formed in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In general, the present invention is directed to a semiconductor device having improved electrical performance characteristics and a method of making such a device. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Referring now to FIG. 1, a cross section view of a semiconductor device 10 is provided. Only those features useful for understanding of the present invention are shown and discussed. Although the various regions and structures of the semiconductor device 10 are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

The semiconductor device 10 includes a base layer 20 upon which a dielectric layer 30 has been formed. Conductive interconnect structures 40 and lines 50 have been formed in the dielectric layer 30 to communicate with the base layer 20. In the illustrated embodiment, the conductive interconnects 40 and lines 50 are composed of copper. However, other conductive materials such as tungsten and aluminum may be used. The conductive interconnects 40 and lines 50 may be formed by a variety of known techniques (e.g., damascene, dual damascene, etc.). The base layer 20, in one illustrative example, may comprise a doped substrate, where the interconnects are communicating with the source/drain regions of a transistor. In another illustrative example, the base layer 20 may comprise a conductive member, such as a conductive line of a previous layer in the semiconductor device. Exemplary materials suitable for use as the dielectric layer 30 are tetraethoxysilane (TEOS), fluorine doped tetraethoxysilane (F-TEOS), and a low-k dielectric (e.g., Black Diamond).

Figure 2:
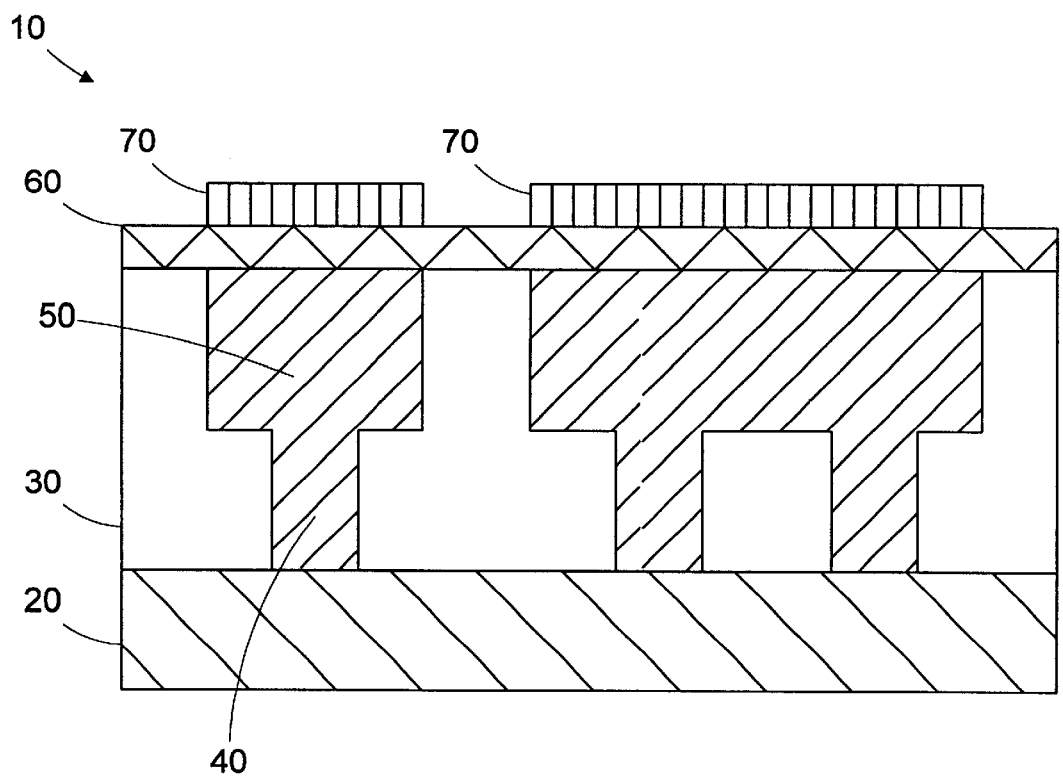
FIG. 2 is a cross section view of the semiconductor device of FIG. 1 after a passivation layer and a patterned photoresist layer has been formed.

Turning now to FIG. 2, a passivation layer 60 is deposited over the dielectric layer 30 and conductive lines 50. A photoresist layer 70 is deposited over the passivation layer 60. The thickness of the passivation layer 60 may range from about 200 to 1000 Angstroms. Suitable materials for the passivation layer 60 are silicon nitride and plasma enhanced silicon nitride. The passivation layer 60 is patterned to expose only the portions of the passivation layer 60 not covering exposed copper (i.e., the photoresist layer 70 covers the lines 50). One technique for patterning the photoresist layer 70 involves using an inverse of the photomask previously used in patterning the trench etch used to form the lines 50. The inverse may be achieved by reversing the sense of the resist (i.e., from a positive resist to a negative resist), or by using a photomask with reversed transparent and opaque areas. If copper features other than the lines 50 are exposed a modified photomask may be required.

Figure 3:
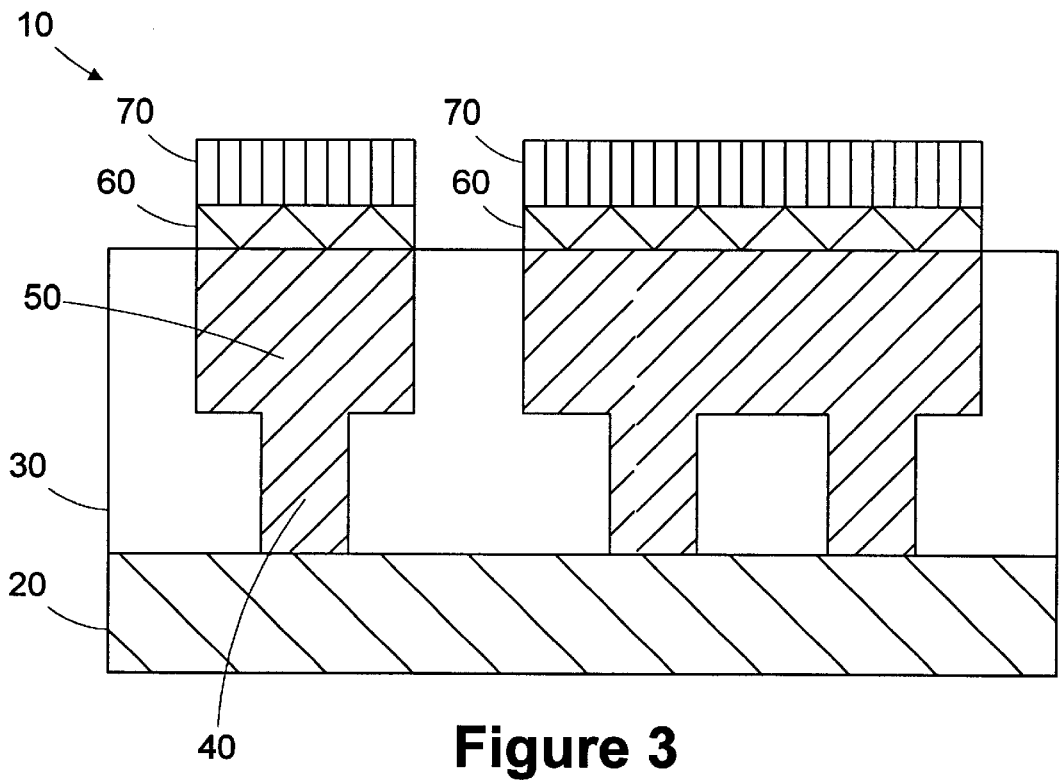
FIG. 3 is a cross section view of the semiconductor device of FIG. 2 after the passivation layer has been patterned.

As seen in FIG. 3, the exposed portions of the passivation layer 60 are removed. In an exemplary embodiment where the conductive lines 50 are copper, the passivation layer 60 is plasma enhanced silicon nitride, and the dielectric layer 30 is TEOS, there exist etch techniques well known to those of ordinary sill in the art to etch the passivation layer 60 comprised of silicon nitride selective to the dielectric layer 30 comprised of TEOS. During such an etch process, care is taken not to expose the copper to the etchants. Such exposure could damage the copper and/or cause problems with the etch.

Figure 4:
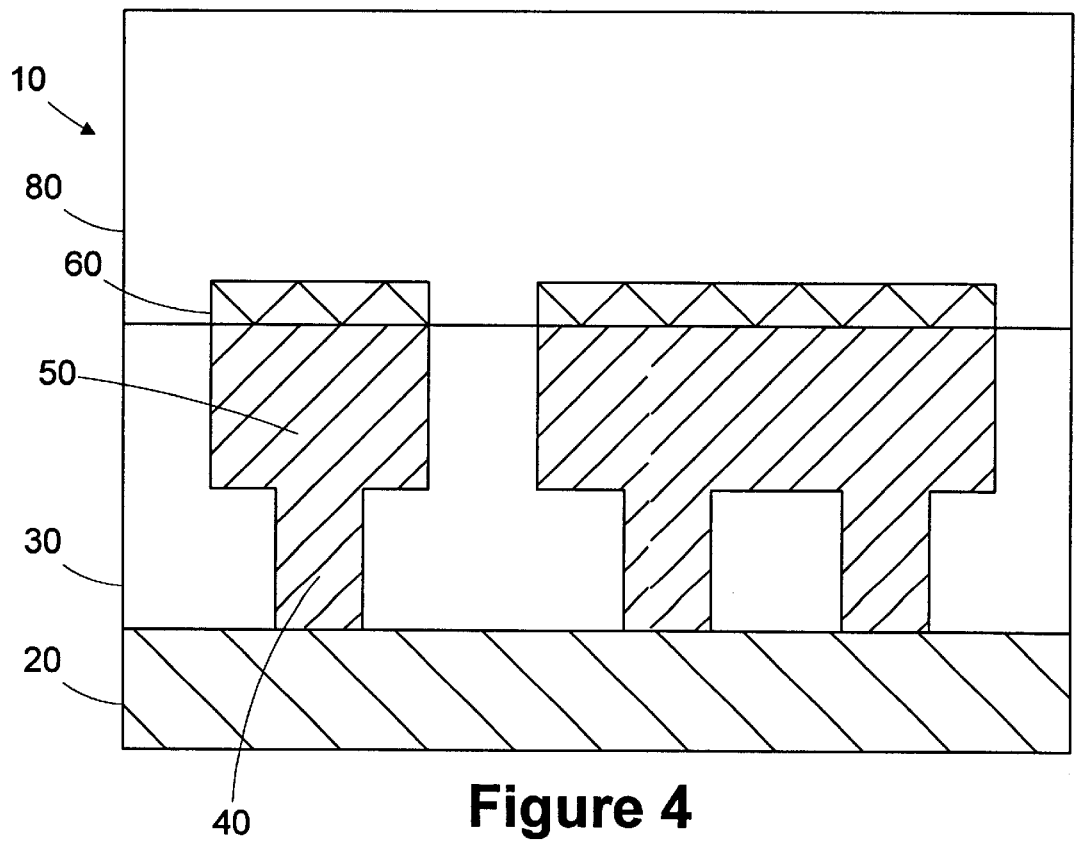
FIG. 4 is a cross section view of the semiconductor device of FIG. 3 after the photoresist layer has been removed and an inter-level dielectric layer has been formed over the passivation layer.

Turning to FIG. 4, the remnants of the photoresist layer 70 are also removed, and an inter-level dielectric layer 80 is formed over the passivation layer 60. Exemplary materials suitable for use as the inter-level dielectric layer 80 are TEOS, F-TEOS, and a low-k dielectric.

Forming the partial-coverage passivation layer 60 as described above has several advantages. First the passivation layer 60 provides the necessary barrier layer to prevent diffusion of the material comprising the lines 50 (e.g., copper) to the substrate and to improve electromigration stability. Second, because the passivation layer 60 does not cover the portions of the dielectric layer 30 between the lines 50, the line-to-line capacitance is less affected by the relatively higher dielectric constant of the passivation layer 60. Finally, because of the reduced coverage of the passivation layer 60, the optical density of the semiconductor device 10 is reduced, allowing more accurate alignment in subsequent processing steps to form additional layers.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:

a first dielectric layer including a plurality of trenches defined therein;

a plurality of conductive interconnections formed in the trenches of the first dielectric layer;

a patterned passivation layer formed above the conductive interconnections; and a second dielectric layer formed above and in contact with the passivation layer and the first dielectric layer.

2. The semiconductor device of claim 1, wherein the conductive interconnections are separated by an exposed portion of the first dielectric layer, and the patterned passivation layer does not cover a substantial portion of the exposed portion of the first dielectric layer.

3. The semiconductor device of claim 1, wherein the conductive interconnections comprise copper.

4. The semiconductor device of claim 1, wherein the passivation layer comprises silicon nitride.

5. The semiconductor device of claim 1, wherein the passivation layer comprises plasma enhanced silicon nitride.

6. The semiconductor device of claim 1, wherein the first dielectric layer comprises at least one of one of tetraethoxysilane, fluorine doped tetraethoxysilane, and a low-k dielectric.

7. The semiconductor device of claim 1, wherein the second dielectric layer comprises at least one of one of tetraethoxysilane, fluorine doped tetraethoxysilane, and a low-k dielectric.

8. The semiconductor device of claim 1, wherein the first dielectric layer and the second dielectric layer comprise a common material.

9. The semiconductor device of claim 1, wherein the first dielectric layer and the second dielectric layer comprise a low-k dielectric.

* * * * *